(12) United States Patent
Wieczorek

(10) Patent No.: US 8,975,588 B2
(45) Date of Patent: Mar. 10, 2015

(54) CONCENTRATING LIGHT TOWARDS A TARGET ELEMENT

(75) Inventor: Herfried Karl Wieczorek, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/126,001

(22) PCT Filed: Jun. 18, 2012

(86) PCT No.: PCT/IB2012/053054
§ 371 (c)(1),
(2), (4) Date: Dec. 13, 2013

(87) PCT Pub. No.: WO2013/001402
PCT Pub. Date: Jan. 3, 2013

(65) Prior Publication Data
US 2014/0103218 A1    Apr. 17, 2014

(30) Foreign Application Priority Data

Jun. 30, 2011   (EP) .................................... 11172171

(51) Int. Cl.
*G02B 6/26*  (2006.01)
*H01L 31/052*  (2014.01)
*H01L 31/055*  (2014.01)
*G01J 1/04*  (2006.01)
*G01T 1/29*  (2006.01)

(52) U.S. Cl.
CPC .............. *G02B 6/26* (2013.01); *H01L 31/0525* (2013.01); *H01L 31/055* (2013.01); *G01J 1/0407* (2013.01); *G01T 1/2985* (2013.01); *Y02E 10/52* (2013.01)
USPC .................................................... 250/363.03

(58) Field of Classification Search
CPC ........ G02B 6/26; G01T 1/2985; G01J 1/0407
USPC ....................................... 250/363.03, 227.11
See application file for complete search history.

(56) References Cited

U.S. PATENT DOCUMENTS

| 4,188,239 A | 2/1980 | Boling |
| 2010/0180932 A1 | 7/2010 | Wang et al. |
| 2010/0275999 A1 | 11/2010 | Buelow, II |

FOREIGN PATENT DOCUMENTS

| WO | 2010096721 A2 | 8/2010 |
| WO | 2011011885 A1 | 2/2011 |
| WO | 2011012545 A1 | 2/2011 |

*Primary Examiner* — David Porta
*Assistant Examiner* — Faye Boosalis

(57) ABSTRACT

An optical device (102) configured for concentrating light towards a target element (104) is provided. The optical device (102) comprises a waveguide element (106) configured for guiding light towards the target element (104), and a wavelength conversion element (108) configured for converting incoming light of a first wavelength into outgoing light of a second wavelength. The wavelength conversion element (108) extends adjacent to the waveguide element (106). An interface (114) between the waveguide element (106) and the wavelength conversion element (108) comprises a surface roughness. The latter may provide for an increased efficiency and low manufacturing costs of the optical device (102).

13 Claims, 5 Drawing Sheets

//(1)

CONCENTRATING LIGHT TOWARDS A TARGET ELEMENT

CROSS-REFERENCE TO PRIOR APPLICATIONS

This application is the U.S. National Phase application under 35 U.S.C. §371 of International Application No. PCT/2012/053054, filed on Jun. 18, 2012, which claims the benefit of European Patent Application No. 11172171.8 filed on Jun. 30, 2011. These applications are hereby incorporated by reference herein.

FIELD OF THE INVENTION

The invention relates to an optical device configured for concentrating light towards a target element, to a photovoltaic apparatus, to a detection apparatus for positron emission tomography, and a method of manufacturing an optical device configured for concentrating light towards a target element.

BACKGROUND OF THE INVENTION

Optical devices are usable for concentrating light towards a target region or a target element located in the target region. It is generally desired to achieve a high amount of light guided by the optical device to be incident on the target element.

In the following, reference is made to a luminescent optical device usable in the technical area of photovoltaic technology without loss of generality.

Such a luminescent optical device may be configured for collecting sunlight along an extension of the optical device, and for guiding the collected sunlight to a photovoltaic element which usually comprises small dimensions. Thus, the required area of the photovoltaic element on which the light is incident may have to be kept low, in order to decrease manufacturing costs for the photovoltaic element.

WO 2011/012545 A1 describes a luminescent optical device for use in a solar cell system. The luminescent optical device comprises a lens structure attached to a top surface of a substantially planar waveguide element. The lens structure comprises a plurality of lenses arranged side-by-side on the waveguide element, and a first wavelength selective mirror layer facing the waveguide element. A luminescent structure comprising luminescent domains is provided on a flat lower surface of the substantially planar waveguide. A second wavelength selective mirror layer is provided on the flat lower surface and the luminescent domains, with the luminescent domains being arranged in between the waveguide and the second wavelength selective mirror layer. In operation of the luminescent optical device, sunlight is incident on the luminescent optical device, and is converted to light of another wavelength by the luminescent domains. The converted light is guided by the waveguide element towards a photovoltaic cell of the solar cell system, and is reflected at the first and second wavelength selective mirrors.

SUMMARY OF THE INVENTION

It is an object of the present invention to provide an optical device configured for concentrating light towards a target element which comprises a high efficiency and low manufacturing costs. Further, it is an object of the present invention to provide a photovoltaic apparatus and a detection apparatus for positron emission tomography comprising such an optical device. Further, it is an object of the present invention to provide an easily executable and inexpensive method of manufacturing such an optical device.

The objects defined above are solved by an optical device configured for concentrating light towards a target element, a photovoltaic apparatus, a detection apparatus for positron emission tomography, and a method for manufacturing an optical device configured for concentrating light towards a target element according to the independent claims.

According to an exemplary aspect of the invention, an optical device configured for concentrating light towards a target element is provided. The optical device comprises a waveguide element configured for guiding light towards the target element, and a wavelength conversion element configured for converting incoming light of a first wavelength into outgoing light of a second wavelength. The wavelength conversion element extends adjacent to the waveguide element. An interface between the waveguide element and the wavelength conversion element comprises a surface roughness.

According to another exemplary aspect of the invention, a photovoltaic apparatus is provided. The photovoltaic apparatus comprises an optical device as described above, and a photovoltaic element connected to a waveguide element of the optical device.

According to another exemplary aspect of the invention, a detection apparatus for positron emission tomography (PET) is provided. The detection apparatus comprises an optical device as described above, and a detecting unit connected to a waveguide element of the optical device.

According to another exemplary aspect of the invention, a method of manufacturing an optical device configured for concentrating light towards a target element is provided. The method comprises providing a waveguide element configured for guiding light towards the target element, providing a wavelength conversion element configured for converting incoming light of a first wavelength into outgoing light of a second wavelength, and arranging the wavelength conversion element and the waveguide element relative to one another such that the wavelength conversion element extends adjacent to the waveguide element. An interface between the waveguide element and the wavelength conversion element comprises a surface roughness.

Within the context of the present application, the term "converting incoming light of a first wavelength into outgoing light of a second wavelength" may particularly denote that incoming light of a single first wavelength or a range of first wavelengths may be converted into the outgoing light comprising a single second wavelength or a range of second wavelengths. Here, a wavelength of the light may be measured in units of nanometers.

The term "interface between a first element and a second element" may particularly denote a contact region between the first and second elements. In particular, the interface may be formed by surfaces of the first and second elements being in physical contact with one another, or by a three-dimensional region between the respective surfaces of the first and second elements. The region may be formed by further spacing layers, glue, a coupling layer etc.

The term "the interface comprises a surface roughness" may particularly denote a (particularly average) surface roughness of one or more surfaces of one or more elements forming part of the interface. In particular, the surface roughness may be measured in units of nanometers or in units of micrometers.

According to the exemplary aspects of the invention, an optical device may be configured for concentrating light towards a target element in that the waveguide element of the optical device may be configured for guiding the light towards the target element. Further, the optical device may provide for a wavelength conversion of light incident on or passing through the wavelength conversion element of the optical device. The converted light may be guided by the waveguide element towards the target element. A surface roughness of the interface between the waveguide element and the wavelength conversion element may serve for reducing an average path length of the light propagating in the waveguide element and thus for avoiding absorption of the light in the waveguide element, since the light may be (irregularly) reflected in accordance with a shape and/or an orientation of a spot of the rough surface of the interface between the waveguide element and the wavelength conversion element. The term "average path length of light" may particularly denote an average of an actual path length of the light propagating within the waveguide element before exiting the waveguide element towards the target element. In particular, the average path length of the light may be different from a "free path length of the light" which may be associated with a propagating length of the light before being adsorbed. In particular, an infinite average path length of the light in the waveguide element may correspond to light being trapped in the waveguide element by multiple reflection events at surfaces of the waveguide element of the optical device without exiting the waveguide element towards the target element. In particular, a prolonged average path length may increase a probability of absorption of the light in the waveguide element.

Thus, the optical device may comprise a high efficiency with respect to light guided towards the target element, since endless trapping of the light in the waveguide element owing to numerous reflection events at outer surfaces of the waveguide element may be prevented. Thus, since the light may be focused to the target element, the light may be concentrated towards the target element.

In particular, a time associated with the light propagating in the waveguide element may be low, since the irregular reflections at the rough surface may decrease the light propagation time within the waveguide element. The latter may be desired when using the optical device for PET applications, since a short light propagation time may correspond to a short time of data acquisition. When using the optical device for a photovoltaic apparatus, a short propagation time may be not a critical issue for a proper operation of the photovoltaic apparatus.

In particular, the optical device may be manufactured in a cost effective way, since the optical device may comprise only few components which may be additionally inexpensive.

Next, further exemplary embodiments of the optical device configured for concentrating light towards a target element will be explained. However, these embodiments also apply to the photovoltaic apparatus, the detection apparatus for positron emission tomography, and the method of manufacturing an optical device configured for concentrating light towards a target element.

In particular, the first wavelength may be smaller than the second wavelength. In particular, the wavelength conversion element may be configured for converting ultraviolet and/or visible light into infrared light.

The interface may be formed by a (physical) contact of the wavelength conversion element and the waveguide element with one another, wherein a surface of the waveguide element and/or a surface of the wavelength conversion element may be rough. Thus, the waveguide element and the wavelength conversion element may be directly contacting one another such that the manufacturing of the optical device may be facilitated. Further, providing the waveguide element and/or the wavelength conversion element with a rough surface may be executed in an easy way particularly prior to its assembling. Further, providing both the waveguide element and the wavelength conversion element with a rough surface may enhance the efficiency of the optical device with respect to an amount of light guided towards the target element, since an increased probability of irregular reflection events of the light towards the target element will be provided.

In particular, only the waveguide element or the wavelength conversion element may comprise the surface roughness. In particular, the interface may comprise a spacing element which may comprise a surface being located adjacent to the waveguide element and/or to the wavelength conversion element and comprising a surface roughness.

The optical device may further comprise a first reflecting element configured for reflecting incoming light, wherein the wavelength conversion element may extend between the waveguide element and the first reflecting element particularly along the entire extension of the waveguide element and/or the first reflecting element. In particular, the wavelength conversion element may be sandwiched between the waveguide element and the first reflecting element. In particular, the first reflecting element may extend adjacent to all surfaces of the first waveguide element except a surface of the waveguide element facing the target element. Thus, the efficiency of the optical device may be further enhanced in that a transmission of light through the wavelength conversion element may be reduced or even eliminated, since the light passing through the wavelength conversion element may be reflected by the first reflecting element back towards the wavelength conversion element and the waveguide element to be guided towards the target element. Further, causing the light to pass through the wavelength conversion element twice may increase the amount of the converted light being guided towards the target element.

In particular, a thickness of the wavelength conversion element may be low in a case when the first reflecting element may be present in the optical device, since the conversion efficiency may be increased by the provision of the first reflecting element.

The optical device may further comprise a second reflecting element configured for reflecting incoming light (particularly of the second wavelength), wherein the waveguide element may extend between the wavelength conversion element and the second reflecting element. In particular, the waveguide element may be sandwiched between the wavelength conversion element and the second reflecting element. In particular, the second reflecting element may extend adjacent and along an entire extension of the waveguide element. In particular, the second reflecting element may extend along a surface of the waveguide element being opposite of the surface of the waveguide element forming part of the interface between the waveguide element and the wavelength conversion element. In particular, the second reflecting element may extend adjacent to all surfaces of the waveguide element except the surface of the waveguide element forming part on the interface and a surface of the waveguide element facing towards the target element. Accordingly, the optical device may comprise a further enhanced efficiency with respect to the amount of light being guided towards the target element, since the second reflecting element may serve for directing light to be eventually scattered out of the waveguide element back towards the waveguide element to be then guided towards the target element.

Another interface between the waveguide element and the second reflecting element may comprise a surface roughness, thereby further increasing the efficiency of the optical device with respect to the amount of light to be guided towards the target element. In particular, the another interface may provide a further measure for reducing an average path length of the light being trapped in the waveguide element by increasing a probability of irregular light reflecting events of the light towards the target element. Further, as detailed above, the propagation time of the light in the waveguide element may be further decreased. Thus, a further increased light concentration towards the target element may be accomplished.

The another interface may be formed by a (physical) contact of the waveguide element and the second reflecting element with one another, wherein a surface of the waveguide element and/or a surface of the second reflecting element may be rough. As detailed above, manufacturing of the optical device may be facilitated by directly connecting the waveguide element and the second reflecting element to one another. Further, the presence of a rough surface of the waveguide element and/or the presence of a rough surface of the second reflecting element may enhance the efficiency regarding to the amount of the light guided towards the target element, since the probability of irregular scattering or reflecting events of the light towards the target element may be increased and an average path length of the light propagating in the waveguide element may be reduced. Designing both the surface of the waveguide element and the surface of the second reflecting element with the surface roughness may significantly increase the later described effects.

The optical device may comprise a layered structure. In particular, at least one element selected of the group consisting of the waveguide element, the wavelength conversion element, the first reflecting element, and the second reflecting element may be configured as a layer. In particular, the waveguide element may be configured as a (bulk) member and/or may be manufactured of glass or a scintillator crystal material, and each of the wavelength conversion element, the first reflecting element, and the second reflecting element may be configured as a layer or a stack of layers. Thus, the manufacturing of the optical device may be facilitated in that conventional techniques, for example, lithography, deposition of film material, melting processes and/or fusion processes may be employed. In particular, such an optical device may comprise a small and compact design and may be thus integratable into various apparatuses configured for different applications, thereby turning the optical device to be versatile usable. Further, the optical device may be manufactured in a cost-effective way in that an amount of material required for forming the layers of the layered structure may be low.

The first reflecting element and/or the second reflecting element may be configured for diffusively reflecting the incoming light and/or for specularly reflecting the incoming light. The term "diffuse reflection of light" may particularly denote a reflecting incidence of light with the reflected light being scattered in all directions instead of a preferential direction which may be particularly defined in accordance with the Snellius law. The term "specular reflection of light" may particularly denote a reflection incidence of light with the reflected light being mirror-like reflected particularly in accordance with the Snellius law. In particular, configuring the first reflecting element and/or the second reflecting element for diffusively reflecting the incoming light may allow for reducing the average path length of the light trapped in the waveguide element. In particular, configuring the first reflecting element and/or the second reflecting element for specularly reflecting the incoming light may represent a measure for tuning the optical efficiency of the optical device, since a measure for a defined orientation of the reflected light may be provided. Thus, the efficiency of the optical device with respect to the amount of light guided towards the target element may be increased.

In particular, both the first reflecting element and the second reflecting element may be configured for diffusively reflecting the incoming light or for specularly reflecting the incoming light. In particular, the first reflecting element or the second reflecting element may be configured for diffusively reflecting the incoming light and the other reflecting element may be configured for specularly reflecting the incoming light, thereby combining both technical effects detailed above within one optical device. In particular, the first reflecting element and/or the second reflecting element may be configured for diffusively and specularly reflecting the light in that a material of these elements may alter along an extension thereof measured adjacent to the waveguide element.

In particular, the first and second reflecting elements may comprise an identical material.

The first reflecting element and/or the second reflecting element may comprise a lacquer material comprising powder particles. In particular, the powder particles may comprise titanium-oxide (Ti—O) molecules, for example titanium dioxide ($TiO_2$), or any other white powder particles, for example aluminum oxide or barium sulfate. Thus, the first reflecting element and/or the second reflecting element may be configured for diffusively reflecting the incoming light. In particular, depending on the kind of the lacquer layer, the first reflecting element and/or the second reflecting element may thus comprise a high reflectivity of incoming light of a particular wavelength range but may show a low intrinsic absorption and low transmission in this wavelength range.

The first reflecting element and/or the second reflecting element may comprise a polymer based material, causing low manufacturing costs of the theses elements.

In particular, the polymer based material may comprise or may be configured as a porous plastic material. In particular, the porous plastic material may comprise at least one plastic material selected of the group consisting of polytetrafluoroethylene (PTFE), and polyvinylidene fluoride (PVDF). In particular, the porous plastic material may comprise or may be configured as polymeric fabric or a fabric made of polymer filaments. In particular, the reflectivity of the porous plastic material may be high, since the increased outer surface of the porous material and/or air filled or trapped within the porous material may result in an increased number of reflection events. Thus, the first reflecting element and/or the second reflecting element may be configured for diffusively reflecting the incoming light. In particular, such a first reflecting element and/or a second reflecting element may, depending on the used material, comprise an increased reflectivity in a particular wavelength range but may show (almost) no optical absorption and low transmission in this wavelength range.

In particular, the polymer based material may comprise a stack of polymer based films or thin layers. In particular, the stack of layers may be arranged on a carrier layer or film. In particular, indices of refraction of the layers of the stack of layers may be (slightly) different to one another. In particular, the light may reflect at surfaces of the different layers such that the reflectivity of the polymer based film material may be high. In particular, such a first reflecting element and/or a second reflecting element may, depending on the used material, comprise an increased reflectivity in a particular wavelength range but may show no optical absorption and low transmission in this wavelength range.

A thickness of the first reflecting element and/or the second reflecting element may be at least about ≥1 micrometer, particularly at least about ≥5 micrometer, further particularly at least about ≥10 micrometer, and/or the thickness of the first reflecting element and/or the second reflecting element may be at most about ≤2000 micrometer, particularly at most about ≤500 micrometer, further particularly at most about ≤200 micrometer. In particular, the efficiency of the optical device with respect to the amount of the light guided towards the target element may be significantly increased with adapting the thickness range to the last mentioned thickness range from about 10 micrometer to about 200 micrometer.

In particular, the first and second reflecting elements may comprise an identical thickness.

In particular, the lacquer based first and/or second reflecting elements may comprise a thickness from at least about ≥2 to at most about ≤200 micrometer. Here, the lacquer layer comprising the white powder particles may represent a good reflecting element such that a low thickness of the first and/or second reflecting elements may be sufficient. In particular, the porous plastic material based first and/or second reflecting elements may comprise a thickness from at least about ≥5 to at most about ≤500 micrometer. Here, an index of refraction of the porous plastic material may be lower than an index of refraction of the white powder imbedded in the lacquer layer, causing the increased thickness of the first and/or second element in comparison to the above detailed lacquer layer. In particular, the polymer film material based first and/or second reflecting elements may comprise a thickness from at least about ≥10 to at most about ≤65 micrometer, particularly to at most about ≤50 micrometer. Here, the polymer film material may represent ideal reflecting elements, thereby causing a low thickness of the first and/or second reflecting elements. Further, the minimum thickness of the polymer film material may be caused by the carrier film of the polymer film material.

In particular, the wavelength conversion element may comprise a phosphor based material, for example a material comprising fluorescent compounds (for example, phosphorous compounds) or a plastic material comprising the fluorescent compounds. Thus, the wavelength conversion element may be configured for converting ultraviolet and/or visible light into infrared light. In particular, manufacturing costs of the optical device may be reduced in that commercially available materials for the wavelength conversion element may be employed. Thus, the optical device may be configured as a luminescent optical device by emitting luminescent light by the wavelength conversion element.

In particular, the optical device may comprise the target element.

In particular, the target element may be configured as the photovoltaic element or a detection unit of the detection apparatus for positron emission tomography. In particular, the detection unit may comprise or may be configured for as a photomultiplier, a photodiode, an avalanche diode or a silicon photomultiplier. In particular, the target element may be directly connected, for example by gluing, to a lateral surface of the waveguide element and/or a lateral surface of the wavelength conversion element.

Next, further exemplary embodiments of the method of manufacturing the optical device configured for concentrating light towards a target element will be explained. However, these embodiments also apply to the optical device, the photovoltaic apparatus, and the detection apparatus for positron emission tomography.

The surface roughness of the interface between the waveguide element and the wavelength conversion element and a surface roughness of an another interface between the waveguide element and a second reflecting element of the optical device may be accomplished by abrading a surface of the wavelength conversion element and/or a surface of the waveguide element (particularly prior to the arranging) and a surface of the waveguide element and/or a surface of the second reflecting element, respectively. Here, the referenced surfaces may correspond to those surfaces of the respective elements being physically in contact with one another. Accordingly, conventionally used and cost-effective techniques for treating the surface(s) forming part in the interface and/or the another interface may be employed, thereby facilitating the method and reducing costs required for executing the method.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
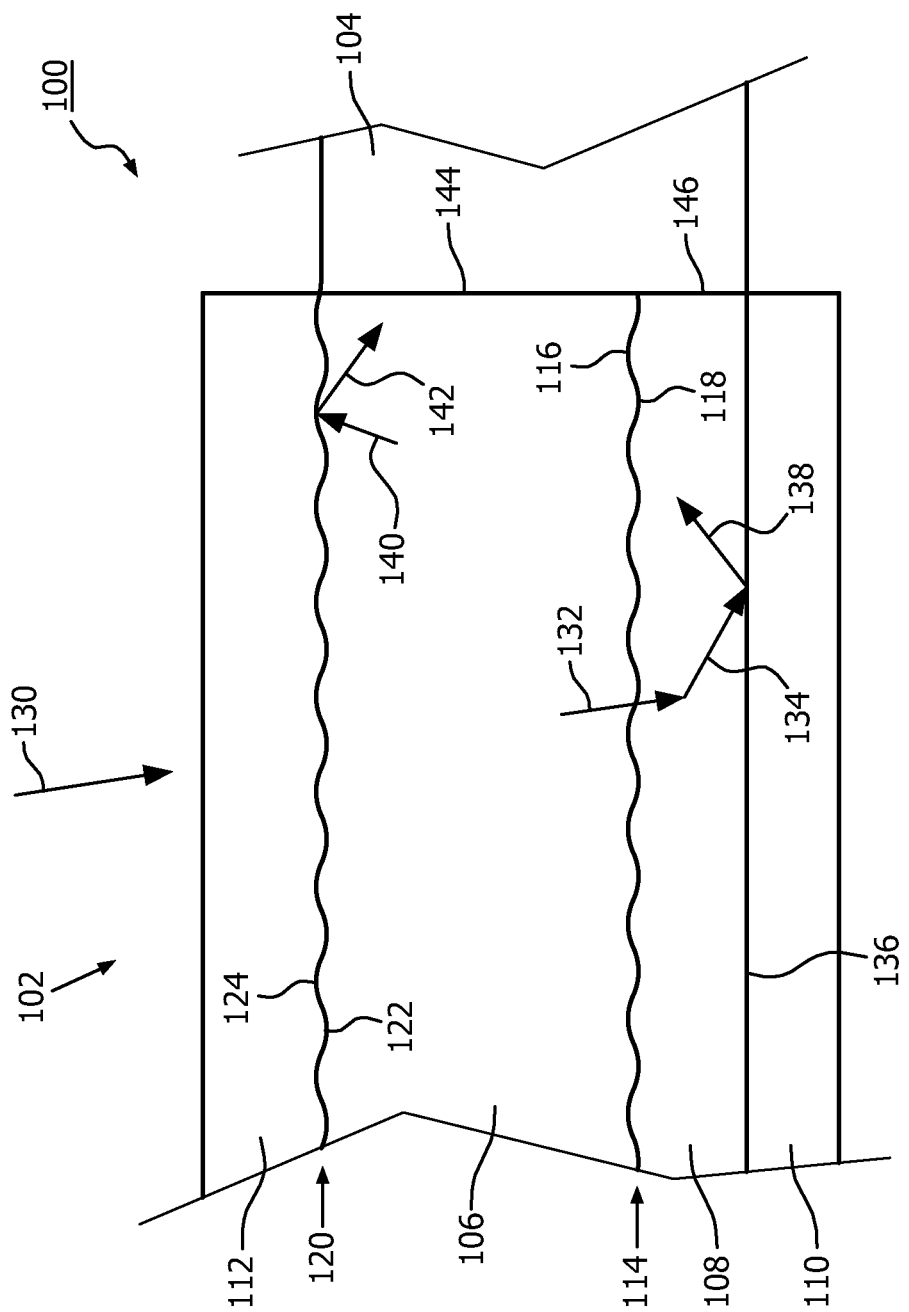
FIG. 1 is a cross-sectional view of a photovoltaic apparatus according to an exemplary embodiment of the invention.

Referring to FIG. 1, a photovoltaic apparatus 100 according to an exemplary embodiment of the invention will be described. The photovoltaic apparatus 100 comprises an optical device 102 configured for concentrating light towards a photovoltaic element 104 of the photovoltaic apparatus 100 which is connected to the optical device 102.

The optical device 102 comprises a waveguide element 106 configured for guiding light towards the photovoltaic element 104, a wavelength conversion element 108 configured for converting incoming ultraviolet and visible light into outgoing infrared light, a first reflecting element 110 configured for reflecting incoming light, and a second reflecting element 112 configured for reflecting incoming light. The wavelength conversion element 108 extends adjacent to the waveguide element 106, and is sandwiched between the waveguide element 106 and the first reflecting element 110. The first reflecting element 110 extends adjacent to the wavelength conversion element 108, and the second reflecting element 112 extends adjacent to the waveguide element 106 opposite to the wavelength conversion element 108.

The optical device 102 comprises a layered structure. The waveguide element 106 is configured as a bulk glass member, and each of the wavelength conversion element 108, the first reflecting element 110, and the second reflecting element 112 is configured as a layer extending along an entire surface of the respective adjacent elements.

A first interface 114 is formed between a surface 116 of the waveguide element 106 and a surface 118 of the wavelength conversion element 108 with the surfaces 116, 118 contacting and thus abutting against one another. The surface 116 of the waveguide element 106 is abraded, and thus comprises an average surface roughness of, for example, from at least about ≥5 nanometers to at most about ≤15 nanometers. The surface 118 of the wavelength conversion element 108 is also rough, since the surface 118 of the layered wavelength conversion element 108 has been adapted to the surface 116 of the waveguide element 106 during a deposition step of a manufacturing process of the optical device 102.

A second interface 120 is formed between a surface 122 of the waveguide element 106 and a surface 124 of the second reflecting element 112. The surface 122 of the waveguide element 106 is opposite to the surface 116 of the waveguide element 106, and the surface 122 of the waveguide element and the surface 124 of the second reflecting element 112 contact one another. Further, the surface 122 of the waveguide element 106 comprises a similar surface roughness compared to the surface 116, since the surface 122 of the waveguide element 106 is also abraded. Accordingly, the surface 122 of the second reflecting element 112 is also rough, since the surface of the layered second reflecting element 112 has been adapted to the surface 122 of the waveguide element 106 during another deposition step of the manufacturing process of the optical device 102.

The wavelength conversion element 108 is configured as a phosphor layer made of phosphorous compounds. Accordingly, the wavelength conversion element 108 shows low intrinsic optical self-absorption in the infrared wavelength range but comprises a high efficiency when converting the incoming ultraviolet and visible sunlight into the outgoing infrared light. A thickness of the wavelength conversion element 108 is 10 micrometer. Alternatively, the wavelength conversion element 108 may be configured as a plastic or lacquer layer comprising embedded phosphorous compounds. Accordingly, the thickness of the wavelength conversion element 108 is reduced compared to an optical device 102 being free of first reflecting element 110 but comprising a wavelength conversion element 108 comprising a thickness of, for example, at least 18 micrometers.

The first reflecting element 110 is configured as a diffusely reflecting element configured for diffusively reflecting the incoming light. The first reflecting element 110 is manufactured as a lacquer layer comprising Rutile molecules in a carrier agent. Rutile is a well known titanium dioxide based white powder material and represents one modification of two naturally available modifications of titanium dioxide (TiO2). Rutile comprises an absorption edge around 400 nanometer. The first reflecting element 110 shows a low intrinsic self-absorption in the blue or ultraviolet wavelength range, and almost no reflectivity in the ultraviolet wavelength range and is usable as reflecting element for visible light and infrared light. Alternatively, the lacquer layer may comprise Anatase which represent the other modification of the two naturally available modifications of TiO2. Anatase comprises a lower index of refraction compared to Rutile, and shows no absorption in the blue and ultraviolet wavelength range. Alternatively, the first reflecting element 110 is manufactured as a lacquer layer comprising another white powder particles such as aluminum oxide and barium sulfate embedded in a carrier agent, and, based on the used material, comprises a high reflectively in the ultraviolet, visible, and/or infrared wavelength range.

Alternatively, the diffusely reflecting first reflecting element 110 may comprise one or more thin porous plastic layers, for example, a PTFE fabric based layer or a PVDF based layer, each of which comprising a thickness from at least 10 micrometers to at most 2000 micrometers.

The first reflecting element 110 may be also configured as a specularly reflecting element made of a VM2000 Enhanced Specular Reflector (ESR) film of 3M of a thickness of 65 μm. The VM2000 ESR film comprises a stack of a plurality of optical active layers arranged on a carrier layer. Each of the layers of the stack of layers comprises a different index of refraction compared to the other layers. This polymeric film material shows no absorption in the visible wavelength range and a reflectivity of about 98.5% in the visible wavelength range regardless of the angle of incidence of the light incident on the first reflecting element 110. Further, the material shows a high reflectivity in the infrared wavelength range. The first reflecting element 110 is manufactured using multi-layer optical film technology.

Another polymer based non-absorbing film material usable for the specularly reflecting first reflecting element 110 may be a Vikuiti™ Enhanced Specular Reflector (ESR) film of 3M showing a 100% reflectivity in the wavelength range from 400 nanometers to 500 nanometers for a perpendicular incidence angle of the light incident on the first reflecting element 110. Further, another non-absorbing polymer material usable for the first reflecting element 110 may be a "blue enhanced" Vikuiti™ material of 3M being available upon request. The used material shows an enhanced reflectivity in a wavelength range from 350 nanometers to 750 nanometers. The Vikuiti™ ESR film and the "blue enhanced" Vikuiti™ film are similarly designed compared to the VM2000 ESR film.

The second reflecting element 110 comprises a similar specularly reflective film comparable to the first reflecting element 110, and in particular a Vikuiti™ ESR film of a thickness of 65 micrometers which is optimized for high reflectivity in the infrared but not for ultraviolet or visible light rage. Thus, the second reflecting element 112 is configured for specularly reflecting infrared light.

In operation of the photovoltaic apparatus 100, sunlight indicated by an arrow 130 is incident on the optical device 102. The sunlight comprises ultraviolet, visible, and infrared wavelengths. As indicated by an arrow 132, the sunlight passes through the second reflecting element 112 and the waveguide element 106, and is scattered and/or absorbed at the phosphorous compounds of the wavelength conversion element 108. Since the second reflecting element 112 is configured to be specularly reflecting for light of infrared wavelength, only a fraction of the infrared light of the sunlight passes through the second reflecting element 112. The phosphorous compounds convert the absorbed light into light of infrared wavelengths by emitting the light of infrared wavelengths. The light to be scattered and absorbed is indicated by an arrow 132, and the converted light is indicated by an arrow 134. The fraction of the infrared light of the sunlight being transmitted through the second reflecting element 112 passes through the wavelength conversion element 108, and may be eventually scattered at the surfaces 118 of the wavelength conversion element 108 and within the wavelength conversion element 108. The converted light and the fraction of the infrared light of the sunlight is reflected by a surface 136 of the first reflecting element 110 back to the wavelength conversion element 108 and to the waveguide element 106. The reflected light is indicated by an arrow 138. Further, the converted light and the fraction of the infrared light of the sunlight incident on the second reflecting element 112 is reflected on the surface 124 of the second reflecting element 112 towards the photovoltaic element 104. The light to be reflected by the second reflecting element 112 is indicated by an arrow 140, and the reflected light is indicated by an arrow 142.

The fraction of the infrared light of the sunlight and the converted light is directed to the photovoltaic element 104 by means of total reflection at the surfaces 116, 122 of the waveguide element 106 and by reflection at the surface 118 of the first reflecting element 110 and at the surface 124 of the second reflecting element 112. Further, the rough surfaces 116, 122 of the waveguide element 106, the rough surface 118 of the first reflecting element 110, and the rough surface 124 of the second reflecting element 112 causes the light to be guided fast towards the photovoltaic element 104 in that reflection events with the reflected light of different orientations are provided. Accordingly, a trapping of the light in the waveguide element 106 and absorption of the light in the waveguide element 106 owing to the light being trapped may be avoided. The efficiency of the wavelength conversion of the sunlight is also increased in that the first reflecting element 110 causes the light to pass twice through the wavelength conversion element 108.

An electrical current is generated by the photovoltaic element 104 based on the amount of the infrared light incident on the photovoltaic element 104.

In the following, a method of manufacturing the optical device 102 according to an exemplary embodiment of the invention will be explained. In a first step, the waveguide element 106 is provided in the form of a glass member. Next, outer opposite surfaces 116, 122 of the waveguide element 106 are abraded. Alternatively, the surfaces 116, 122 of the waveguide element 106 are grinded, chemically etched or sand blasted. In a next step, the wavelength conversion element 108 is laminated along the surface 116 of the waveguide element 106 using a deposition technique. Thereupon, the first reflecting element 110 is laminated along the outer surface 116 of the wavelength conversion element 108 by means of vapor deposition, and the second reflecting element 112 is attached to the outer surface 120 of the wavelength conversion element 106. Further, the second reflecting element 112 is laminated along all other exposed surfaces of the waveguide element 106 except a lateral surface 144 of the waveguide element 116 facing the photovoltaic element 104 in an assembled state of the photovoltaic apparatus 100. Thus, the optical device 102 is manufactured. In a next step, the photovoltaic element 104 is glued to the lateral surface 144 of the waveguide element 106 and to a lateral surface 146 of the wavelength conversion element 108. Accordingly, the photovoltaic apparatus 100 is manufactured.

Figure 2:
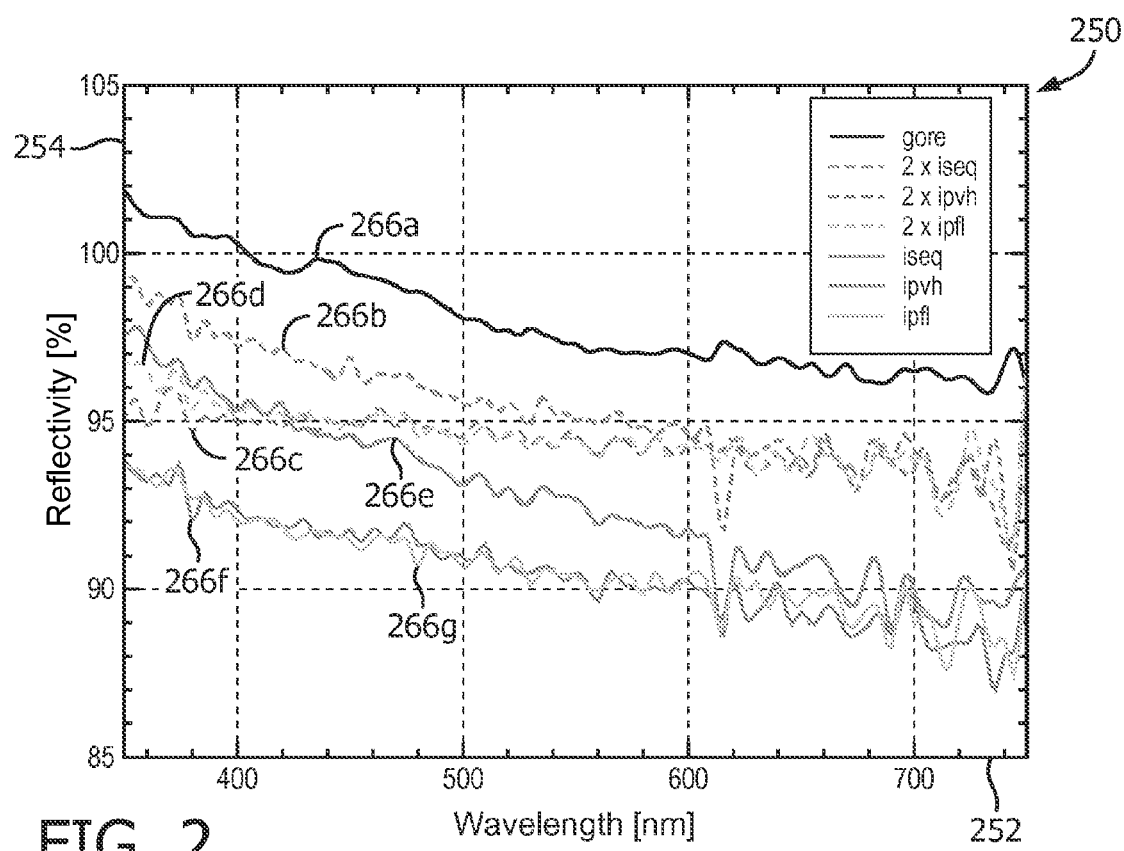
FIG. 2 is a diagram illustrating a wavelength dependency of a first reflecting element of an optical device of the photovoltaic apparatus of FIG. 1 comprising different porous plastic materials.

Referring to FIG. 2, a wavelength dependency of a reflectivity of the first reflecting element 110 manufactured by different porous plastic materials will be explained. A respective diagram 250 comprises an abscissa 252 indicating the wavelength (measured in nanometer), and an ordinate indicating the reflectivity (measured in percentage %). It is noted that illustrated reflectivity values above 100% are caused by an insufficient calibration of the measurement equipment, and in particular of the used reference reflecting element for blue light. A curve 256a indicates the wavelength dependency of the reflectivity of a PTFE fabric of GORE® with a thickness of 0.5 millimeter. The illustrated reflectivity comprises 100% in the blue light wavelength range and in the near ultraviolet wavelength range, and decreases to about 96.5% around 750 nanometer. Curves 256b-d indicate the wavelength dependency of the reflectivity of PVDF membrane layers of thickness of 0.20 micrometer of a specification ISEQ, IPVH, and IPFL of Millipore. The curves 256b-d show reflectivity values between 95% and 100% at a wavelength of 350 nanometer, which are decreasing to values between 90% and 97% at a wavelength of about 750 nanometer. Curves 256e-g indicate the wavelength dependency of the reflectivity of the first reflecting element 110 comprising materials identical to the respective one of the curves 256b-d, however, with an approximately halved thickness of 0.11 micrometer. The curves 256e-g show an overall reduced reflectivity with values between 93% and 98% at a wavelength of 350 nanometer, which is decreasing to reflectivity values around 90% at a wavelength of 750 nanometer. Accordingly, increasing a thickness of the first reflecting element 110 manufactured by the porous plastic material results in an increase in the reflectivity in the entire wavelength range of ultraviolet, visible, and infrared light. The latter effect similarly holds for the another above detailed materials of the first reflecting element 110. Further, the first reflecting element 110 shows no optical absorption, and is therefore ideally suited as a reflecting element for the visible, ultraviolet and infrared wavelength range.

Figure 3:
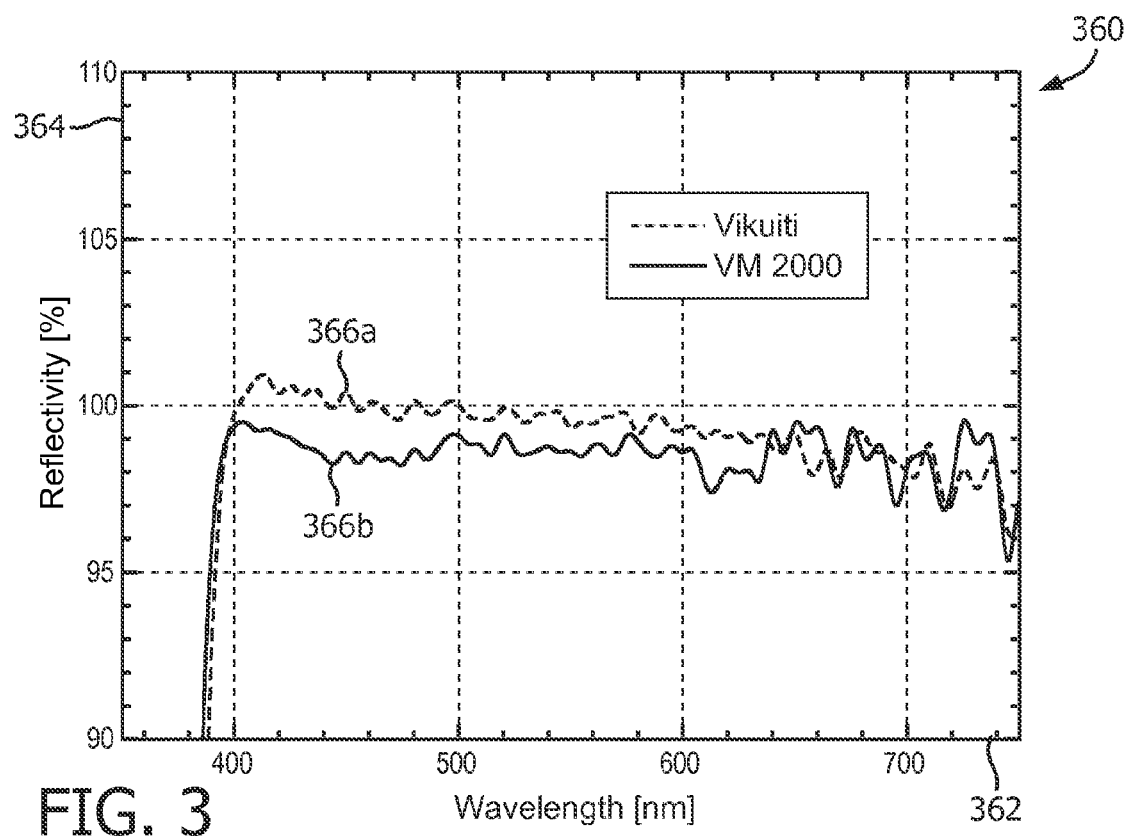
FIG. 3 is a diagram illustrating a wavelength dependency of a reflectivity of the first reflecting element of the optical device of the photovoltaic apparatus of FIG. 1 comprising different polymer film based materials.

Referring to FIG. 3, a wavelength dependency of a reflectivity of a specularly reflecting first reflecting element 110 manufactured by the non-absorbing polymer materials detailed above with respect to FIG. 1 will be explained. A diagram 360 comprises an abscissa 362 corresponding to the wavelength (measured in nanometer), and an ordinate corresponding to the reflectivity (measured in percentage %). A curve 366a indicates the wavelength dependency of the reflectivity of a first reflecting element 110 comprising a single 65 micrometer thick 100% polymer Vikiuti™ ESR film, and shows a 100% reflectivity in the entire visible wavelength range for an angle of incidence of larger than an angle associated with a light total reflection at the film. A curve 366b indicates the wavelength dependency of the reflectivity of a first reflecting element 110 comprising a 65 micrometer thick VM 2000 film, and shows a reflectivity of about 98.5% in the wavelength range from 400 nanometer to 500 nanometer for a perpendicular angle of incidence of the light on the film. These films do not show any absorption in the visible wavelength range.

Figure 4:
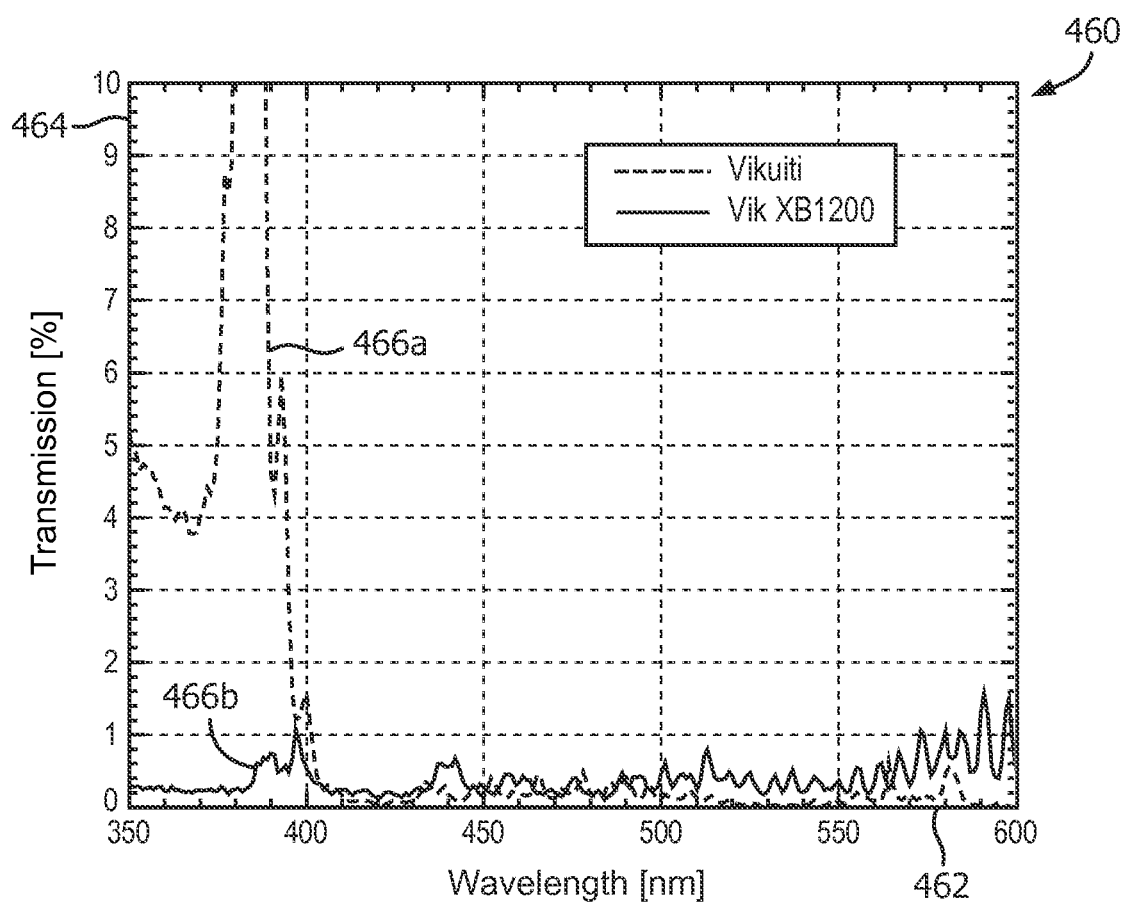
FIG. 4 is a diagram illustrating a wavelength dependency of a transmission of the first reflecting element of the optical device of the photovoltaic apparatus of FIG. 1 comprising different polymer film based materials.

Referring to FIG. 4, a wavelength dependency of a transmission of the first reflecting element 110 manufactured by another different specularly reflecting materials will be explained. A diagram 460 comprises an abscissa 462 corresponding to a wavelength (measured in nanometer), and an ordinate of the diagram 460 corresponds to the transmission (measured in percentage %). A curve 466a corresponds to the transmission of the first reflecting element 110 comprising the above detailed Vikuity™ ESR film with a thicknesses of 65 micrometers. A curve 466b indicates a transmission of a first reflecting element 110 comprising—similar to the above detailed "blue enhanced" Vikuiti™ film—another "blue enhanced" Vikuiti™ film of a specification XB1200 and a thickness of 65 micrometers. The curves 466a, b show a transmission of less than 0.5% in a wavelength range from 400 nanometers to 600 nanometers, turning the material of these first reflecting elements 110 ideally suited for ultraviolet and visible light reflecting elements. Further, since the transmission values of these first reflecting elements 110 in the infrared range are below 2%, the employed materials are suitable for reflecting the converted infrared light.

Figure 5:
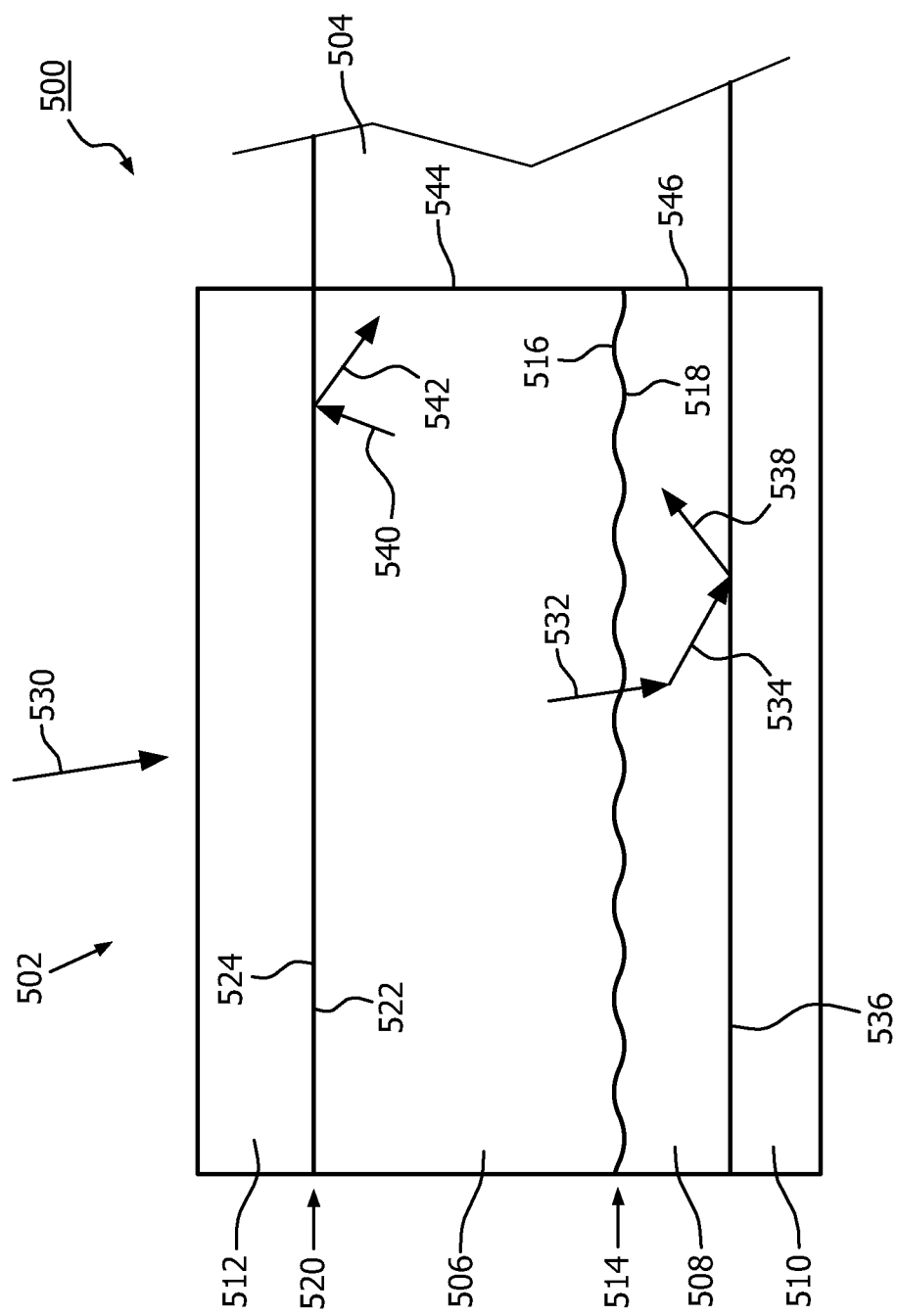
FIG. 5 is a cross-sectional view of a detection apparatus for positron emission tomography according to an exemplary embodiment of the invention.

Referring to FIG. 5, a detection apparatus 500 for positron emission tomography according to an exemplary embodiment of the invention will be explained. The detection apparatus 500 comprises an optical device 502 attached to a detection unit 504 via a lateral surface 544 of a waveguide element 506 of the optical device 502 and a lateral surface 546 of a wavelength conversion element 508 of the optical device 502. The detection unit 504 is configured as a photomultiplier. Alternatively, the detection unit 504 is configured as a photodiode, an avalanche diode or a silicon photomultiplier. The optical device 502 is similarly designed compared to the optical device 102. However, the waveguide element 506 is configured as lutetium-yttrium oxy-orthosilicate (LYSO) scintillator crystal, and is configured for converting incoming gamma (γ) quanta to outgoing ultraviolet light. Further, all surfaces of the waveguide element 506 are polished except a side surface 516 of the waveguide element 506 which faces the first reflecting element 510 and is abraded. Alternatively, the surfaces 516, 522 of the waveguide element 506 are abraded.

An operation of the detection apparatus 500 is identical to an operation of the photovoltaic apparatus 100, however, instead of sunlight, the γ-quanta having an energy of 511 kilo-electronvolt and being generated by an electron-positron-annihilation within a body of a patient are incident on the optical device 502. The waveguide element 502 converts the γ-particles into ultraviolet light which is then incident on the wavelength conversion element 508 and/or passing through the wavelength conversion element 508.

A method of manufacturing the detection apparatus 500 is similar to a method of manufacturing the photovoltaic apparatus 100. However, the waveguide element 506 is provided as a bulk crystal, and all surfaces 522 except the surface 516 are polished. The surface 516 of the waveguide element 516 is abraded. Further, instead of the photovoltaic element 104 the detecting unit 504 is glued to the lateral surface 544 of the waveguide element 506 and the lateral surface 546 of the wavelength conversion element 508.

Figure 6:
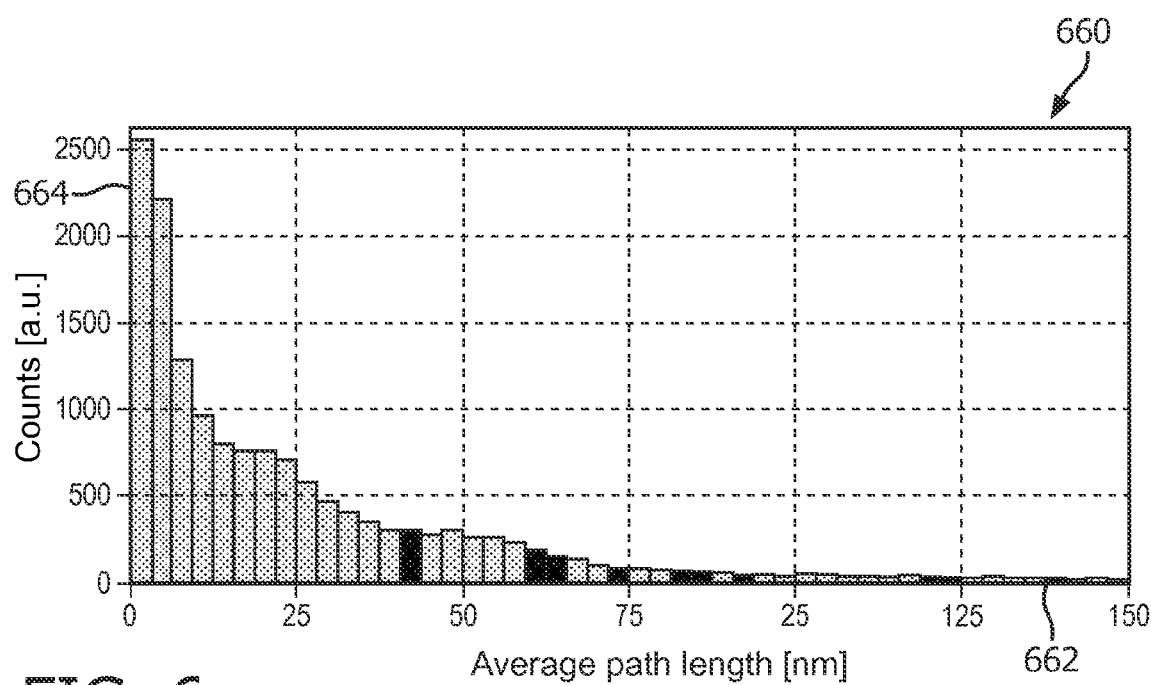
FIG. 6 is a diagram illustrating a length distribution of an average path length in a waveguide element of an optical device of the detection apparatus of FIG. 5.

Referring to FIG. 6, a distribution of average path lengths of the light propagating in the optical device 502 comprising a cuboid shaped crystalline waveguide element 506 of dimensions of 22 millimeter×4 millimeter×4 millimeter is illustrated. In this example, all surfaces of the crystal are polished. A diagram 660 has an abscissa 662 indicating the average path length (measured in millimeter), and an ordinate 664 (measured in counts). The diagram 660 shows path length of up to 150 millimeter corresponding to a few times the crystal length. This long path length is caused by the trapping of light in the crystal comprising the polished surfaces. Assuming a decimeter length of the waveguide element 506 may result in an average path length of the light in the order of meters.

Figure 7:
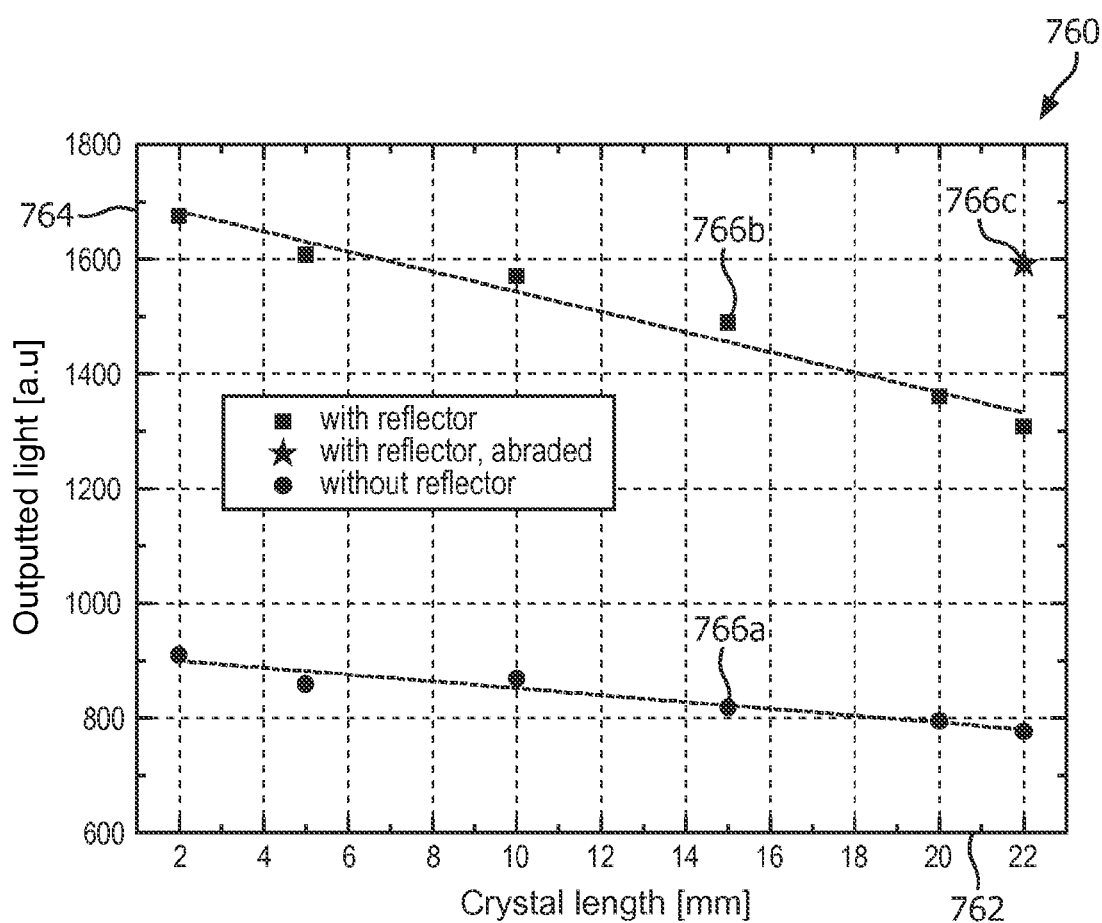
FIG. 7 is a diagram illustrating a crystal length dependency of an amount of light outputted by the optical device of the detection apparatus of FIG. 5.

Referring to FIG. 7, an amount of outputted light for different lengths of the LYSO crystal based waveguide element 506 of the optical device 502 is illustrated. The outputted light corresponds to the light outputted at the lateral surface 544 of the waveguide element 506. A diagram 760 comprises an abscissa 762 indicating the crystal length of the waveguide element 506 (measured in millimeter), and an ordinate 764 indicating the amount of outputted light determined at a peak position of a measured light peak (presented in arbitrary units a. u.). The outputted light corresponds to the light outputted at the lateral surface 544 of the waveguide element 506. Curves 766a-c comprise few values and one value, respectively, and show the amount of outputted light for an optical device 502 comprising no first and second reflecting elements 510, 512, for an optical device 502 comprising identically designed first and second reflecting elements 510, 512 arranged at all surfaces of the waveguide element 506 (hence at five surfaces of the cuboid shaped crystal) except at a lateral surface 544 of the waveguide element 506, and for an optical device 502 comprising the identically designed first and second reflecting elements 510, 512 arranged at all surfaces 516, 522 of the waveguide element 506 except the lateral surface 544 of the waveguide element 506 in combination with the abraded surface 516 and the other polished surfaces 522, 544 of the crystal based waveguide element 506. The lines through the curves 766a, b are guides to the eye. As indicated by the curves 566a, b, the amount of the outputted light decreases with increasing crystal length. The latter effect results from a prolonged average path length within the crystal material of the waveguide element 506, since more absorption events may occur in the waveguide element 506. Further, for an identical crystal length, the amount of the outputted light is higher for an optical device 502 comprising the identical first and second reflecting elements 510, 512 at all surfaces 516, 522 except the one lateral surface 544, since the light is concentrated back to the waveguide element 506 by the reflecting elements 510, 512 and scattering of the light out of the waveguide element 110 is avoided. Further, as indicated by the curve 766a-c, evaluated at the crystal length of 12 millimeter, the amount of the outputted light is increased by 20% for the optical device 502 comprising the abraded surface 516 compared to the curve 766b, since the light trapped in the waveguide element 506 is irregularly reflected at the surface 516 of the waveguide element 506, and is concentrated fast towards the detection unit 504. An increase of up to 25% may be achieved.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. An optical device configured for concentrating light towards a target element, the optical device comprising:
   a waveguide element configured for guiding light towards the target element, and
   a wavelength conversion element configured for converting incoming light of a first wavelength into outgoing light of a second wavelength, wherein the wavelength conversion element extends adjacent to the waveguide element, and
   a first reflecting element configured for reflecting incoming light, wherein the wavelength conversion element extends between the waveguide element and the first reflecting element and wherein the waveguide element adjacent to the wavelength conversion element comprises a rough surface for reducing an average path length of light propagating in the waveguide element by irregularly reflecting the propagating light in accordance with a shape and/or an orientation of a spot of the rough surface.

2. The optical device according to claim 1, wherein an interface is formed by a contact of the wavelength conversion element and the waveguide element with one another, wherein a surface of the waveguide element and a surface of the wavelength conversion element is rough.

3. The optical device according to claim 1, the optical device further comprising:

a second reflecting element configured for reflecting incoming light, wherein the waveguide element extends between the wavelength conversion element and the second reflecting element.

4. The optical device according to claim 1, wherein the optical device comprises a layered structure.

5. The optical device according to claim 1, wherein the first reflecting element and/or the second reflecting element is configured for diffusively reflecting the incoming light and/or for specularly reflecting the incoming light.

6. The optical device according to claim 1, wherein the first reflecting element and/or the second reflecting element comprises a lacquer material comprising powder particles.

7. The optical device according to claim 1, wherein the first reflecting element and/or the second reflecting element comprises a polymer based material.

8. The optical device according to claim 1, wherein a thickness of the first reflecting element and/or the second reflecting element is at least 1 micrometer.

9. A photovoltaic apparatus, the photovoltaic apparatus comprising:
   an optical device according to claim 1, and
   a photovoltaic element connected to a waveguide element of the optical device.

10. A detection apparatus for positron emission tomography, the detection apparatus comprising:
    an optical device according to claim 1, and
    a detection unit connected to a waveguide element of the optical device.

11. An optical device configured for concentrating light towards a target element, the optical device comprising:
    a waveguide element configured for guiding light towards the target element, and
    a wavelength conversion element configured for converting incoming light of a first wavelength into outgoing light of a second wavelength, wherein the wavelength conversion element extends adjacent to the waveguide element,
wherein the waveguide element adjacent to the wavelength conversion element comprises a rough surface for reducing an average path length of light propagating in the waveguide element by irregularly reflecting the propagating light in accordance with a shape and/or an orientation of a spot of the rough surface and wherein another interface of the waveguide element adjacent to the second reflecting element comprises a surface roughness.

12. The optical device according to claim 11, wherein the another interface is formed by a contact of the waveguide element and the second reflecting element with one another, wherein a surface of the waveguide element and a surface of the second reflecting element is rough.

13. A method of manufacturing an optical device configured for concentrating light towards a target element, the method comprising:
    providing a waveguide element configured for guiding light towards the target element,
    providing a wavelength conversion element configured for converting incoming light of a first wavelength into outgoing light of a second wavelength, and
    arranging the wavelength conversion element and the waveguide element relative to one another such that the wavelength conversion element extends adjacent to the waveguide element,
    providing a first reflecting element configured for reflecting incoming light, wherein the wavelength conversion element extends between the waveguide element and the first reflecting element
wherein the waveguide element adjacent to the wavelength conversion element is provided with a rough surface for reducing an average path length of light propagating in the waveguide element by irregularly reflecting the propagating light in accordance with a shape and/or an orientation of a spot of the rough surface.

* * * * *